United States Patent
Maaskant et al.

(10) Patent No.: US 10,381,317 B2
(45) Date of Patent: Aug. 13, 2019

(54) TRANSITION ARRANGEMENT COMPRISING A CONTACTLESS TRANSITION OR CONNECTION BETWEEN AN SIW AND A WAVEGUIDE OR AN ANTENNA

(71) Applicant: Telefonaktiebolaget LM Ericsson (publ), Stockholm (SE)

(72) Inventors: Rob Maaskant, Göteborg (SE); Alhassan Aljarosha, Borås (SE); Ashraf Uz Zaman, Hisings Backa (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 16/071,693

(22) PCT Filed: Jan. 18, 2017

(86) PCT No.: PCT/EP2017/051002
§ 371 (c)(1),
(2) Date: Jul. 20, 2018

(87) PCT Pub. No.: WO2017/137224
PCT Pub. Date: Aug. 17, 2017

(65) Prior Publication Data
US 2019/0057945 A1 Feb. 21, 2019

(30) Foreign Application Priority Data
Feb. 12, 2016 (SE) ........................ 1650181

(51) Int. Cl.
*H01P 3/12* (2006.01)
*H01P 5/02* (2006.01)
(Continued)

(52) U.S. Cl.
CPC .............. *H01L 23/66* (2013.01); *H01P 3/121* (2013.01); *H01P 3/123* (2013.01); *H01P 5/024* (2013.01);
(Continued)

(58) Field of Classification Search
USPC ......... 333/21 R, 24 R, 33, 246, 248; 342/27, 342/104; 343/700 MS, 731, 737, 767;
(Continued)

(56) References Cited

U.S. PATENT DOCUMENTS

| 4,636,753 A | 1/1987 | Geller et al. |
| 10,014,566 B2 * | 7/2018 | Takeda ................... H01P 5/107 |

(Continued)

FOREIGN PATENT DOCUMENTS

| EP | 2500978 A1 | 9/2012 |
| WO | 2010003808 A1 | 1/2010 |

(Continued)

OTHER PUBLICATIONS

Cano, J. L., "Full-Band Air-Filled Waveguide-to-Substrate Integrated Waveguide (SIW) Direct Transition", IEEE Microwave and Wireless Components Letters, vol. 25, No. 2, Feb. 1, 2015, pp. 79-21, IEEE.

(Continued)

*Primary Examiner* — Dao H Nguyen
(74) *Attorney, Agent, or Firm* — Coats & Bennett, PLLC

(57) ABSTRACT

The present invention relates to a transition arrangement (100) comprising a transition between a substrate integrated waveguide, SIW, (20) of a circuit arrangement and a waveguide and/or antenna structure (10). It comprises a first conducting plate (1) and a second conducting plate (2). The SIW (20) is arranged on said first conducting plate, and an impedance matching structure (4) is connected to the second conducting plate. For a transition between the SIW (20) and (Continued)

the waveguide structure, the impedance matching structure (4) is extended with an open circuit $\lambda g/4$ stub (5) for inverting the impedance to effectively provide a short-circuit connection, thereby electromagnetically coupling the EM-field between the SIW and the impedance matching structure (4), which is so arranged that, when the first and second conducting plates are interconnected, or merely assembled in a contactless manner in the case of gap structures, the open circuit $\lambda g/4$ stub (5) is disposed above the SIW without any galvanic contact between the SIW and the impedance matching structure (4) and between the SIW (20) and the $\lambda g/4$ stub (5), providing a planar, contactless transition.

23 Claims, 11 Drawing Sheets

(51) Int. Cl.

| | | |
|---|---|---|
| *H01Q 1/22* | (2006.01) | |
| *H01L 23/66* | (2006.01) | |
| *H01P 1/207* | (2006.01) | |
| *H01P 11/00* | (2006.01) | |
| *H01P 3/123* | (2006.01) | |
| *H01Q 13/02* | (2006.01) | |
| *H01Q 13/10* | (2006.01) | |

(52) U.S. Cl.
CPC .......... *H01P 11/002* (2013.01); *H01Q 1/2283* (2013.01); *H01Q 13/02* (2013.01); *H01Q 13/10* (2013.01); *H01L 2223/6633* (2013.01); *H01L 2223/6683* (2013.01); *H01P 1/207* (2013.01)

(58) Field of Classification Search
USPC .............. 385/14, 89, 132; 257/664, E33.066
See application file for complete search history.

(56) References Cited

U.S. PATENT DOCUMENTS

| | | | | |
|---|---|---|---|---|
| 10,128,556 | B2* | 11/2018 | Ligander | ................ H01P 3/121 |
| 2009/0121952 | A1* | 5/2009 | Shibuya | ................ H01P 5/022 |
| | | | | 343/767 |
| 2013/0234904 | A1 | 9/2013 | Blech | |
| 2014/0077893 | A1* | 3/2014 | Lee | .......................... C04B 26/18 |
| | | | | 333/33 |
| 2014/0091884 | A1 | 4/2014 | Flatters | |
| 2014/0111293 | A1* | 4/2014 | Madeberg | ................. H01P 5/08 |
| | | | | 333/246 |
| 2016/0056541 | A1* | 2/2016 | Tageman | ............... H01Q 13/18 |
| | | | | 343/771 |
| 2016/0111764 | A1* | 4/2016 | Kim | ......................... H01P 5/024 |
| | | | | 333/21 R |
| 2016/0204495 | A1* | 7/2016 | Takeda | ..................... H01P 5/107 |
| | | | | 375/257 |

FOREIGN PATENT DOCUMENTS

| | | | |
|---|---|---|---|
| WO | 2012123473 | A1 | 9/2012 |
| WO | 2013056729 | A1 | 4/2013 |
| WO | 2014154232 | A1 | 10/2014 |

OTHER PUBLICATIONS

Kildal, P-S. et al., "Local Metamaterial-Based Waveguides in Gaps Between Parallel Metal Plates", IEEE Antennas and Wireless Propagation Letters, vol. 8, Jan. 1, 2009, pp. 84-87, IEEE.

Rajo-Iglesias, E., "Numerical studies of bandwidth of parallel-plate cut-off realised by a bed of nails, corrugations and mushroom-type electromagnetic bandgap for use in gap waveguides", IET Microwaves, Antennas & Propagation, vol. 5, Iss. 3, received May 21, 2009, revised Jul. 22, 2010, published Jan. 1, 2011, pp. 282-289, The EIT.

Brazález, A. et al., "Investigation of a Microstrip-to-Ridge Gap Waveguide Transition by Electromagnetic Coupling", Proceedings of the 2012 IEEE International Symposium on Antennas and Propagation, Jul. 8, 2012, pp. 1-2, IEEE.

Zaman, A. et al., "Design of a simple transition from microstrip to ridge gap waveguide suited for MMIC and antenna integration", IEEE Antennas and Wireless Propagation Letters, vol. 12, Feb. 19, 2013, pp. 1-4, IEEE, ISSN: 1536-1225.

Djerafi, T. et al., "Substrate Integrated Waveguide Antennas", Handbook of Antenna Technologies, Jan. 1, 2015, pp. 1-60, Springer Science+Business Media, Singapore 2015.

\* cited by examiner

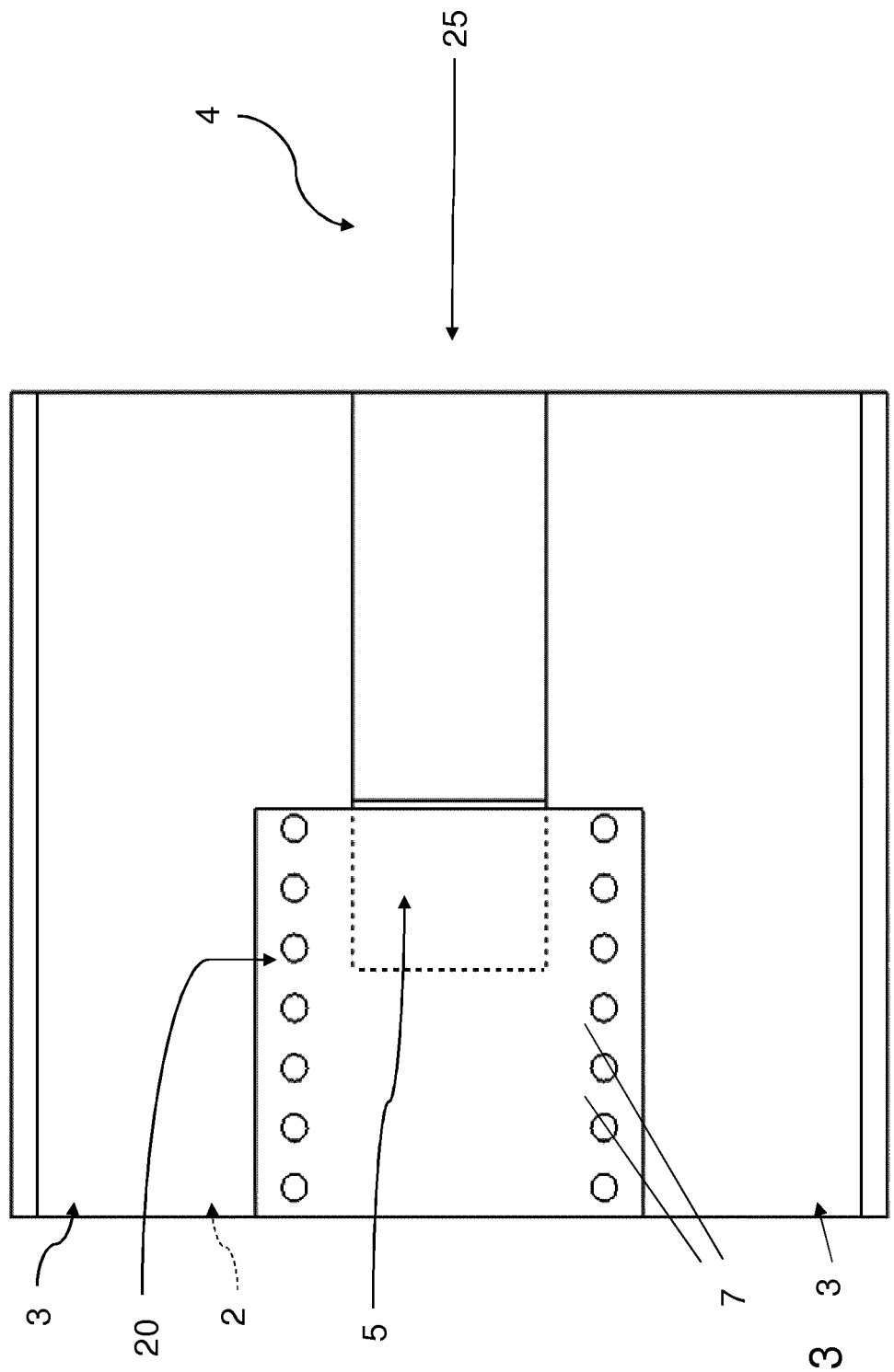

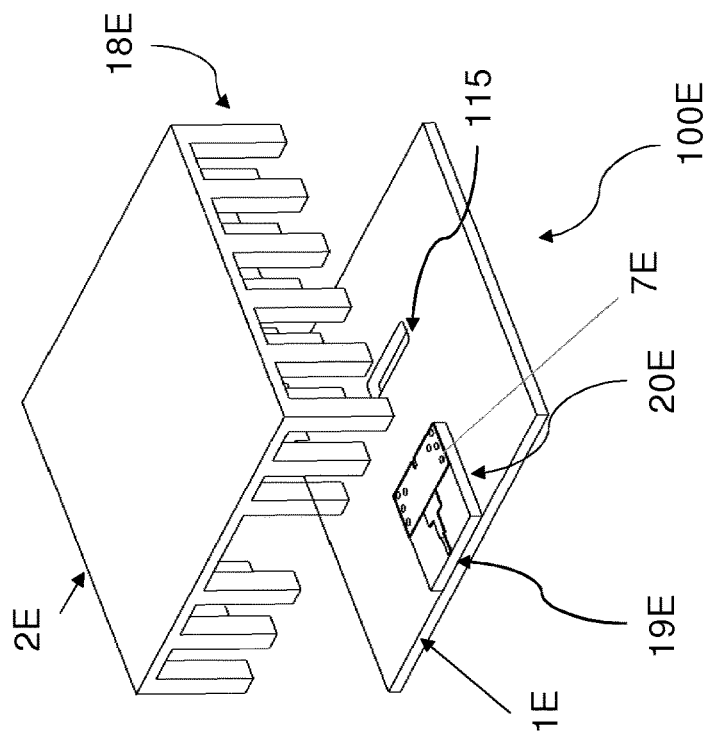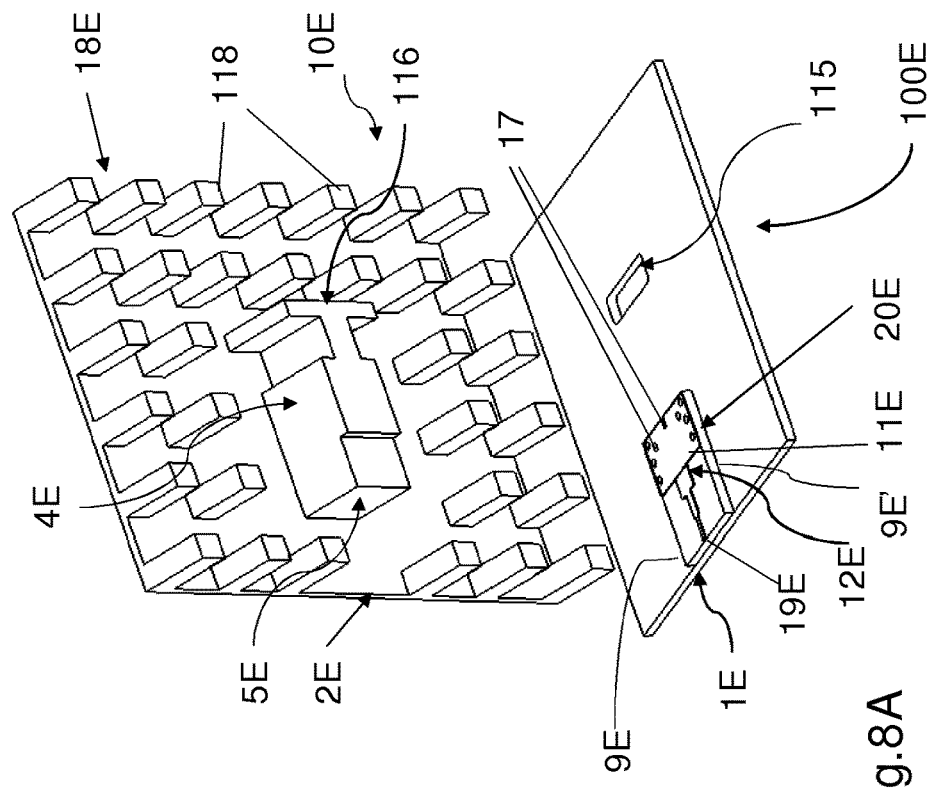

TRANSITION ARRANGEMENT COMPRISING A CONTACTLESS TRANSITION OR CONNECTION BETWEEN AN SIW AND A WAVEGUIDE OR AN ANTENNA

TECHNICAL FIELD

The present invention relates to a transition arrangement comprising a transition between an SIW, associated with, or of, a circuit arrangement, e.g. an active or a passive circuit arrangement, and a waveguide or an antenna or antenna interface, having the features of the first part of claim 1.

The invention also relates to a method for providing a transition arrangement having the features of the first part of claim 23.

BACKGROUND

Transitions, or connections, between a circuit and e.g. a waveguide or an antenna, are needed for many different applications, e.g. within microwave or millimeter wave technologies etc. Particularly due to the increasing demand for high-speed wireless links, e.g. for ultra-fast mobile Internet, high resolution automotive radar links, Gbit/s data and video links, accurate imaging devices for medical and security applications etc. it is attractive to be able to use the millimeter, or the sub-millimeter, wave frequency region, since in these frequency regions, larger frequency bandwidths are available. Thus, the use of high frequencies is steadily gaining more interest.

For example, electronically steered antennas in an antenna array system based on e.g. mm-wave technology have an enormous potential, being capable of multiple instantaneous beams, each of which corresponding to a relatively large antenna aperture area providing high receiving sensitivity or a large antenna gain. However, such systems are complex and high costs are involved with complex antenna array systems employing many antenna elements. At millimeter-wave frequencies it becomes possible to combine antennas with integrated circuits in a single process since the size of the antennas is reduced to a fraction of a millimeter, allowing them to be placed on a carrier together with an integrated circuit (IC). This reduces the fabrication costs and time, and the antennas are smaller than dielectric-free antennas.

Several problems are associated with transitions between e.g. a package comprising a high-frequency circuit and a waveguide port or an antenna. A waveguide transition generally converts its dominant waveguide mode to a microstrip or coplanar transmission line mode.

Direct ridge-to-transmission line connections have been proposed, but suffer from drawbacks, particularly from a manufacturing point of view, since the circuit may easily break.

For a connection between a transmission line and a chip (circuit) a bond-wire or a flip-chip connection has been used. Such a connection contributes with a substantial reactance at high frequencies, causing extra losses and reduction in the achievable bandwidth. Another disadvantage in using bond-wire connections at high frequencies is that bond-wires may lead to impedance mismatch, are inductive and hence limit the bandwidth and the bond-pad contact area of the circuit becomes very small at high frequencies and bonding often destroys the high-frequency pad, thus affecting the yield. Bond-wires may further produce spurious radiation and may excite cavity modes when packaged. Moreover, e.g. for antennas, the substrate on which the antennas are located will be lossy at millimeter-wave frequencies, which means that e.g. the antenna radiation efficiency is reduced. A low radiation efficiency, however, is not acceptable for systems requiring high power efficiency, or systems handling high powers. For example, in communication systems high SNR (Signal-to-Noise Ratio) it is of utmost importance to allow the use of higher-level modulation schemes maximizing the data rate. Thus, such known solutions concerning antenna/waveguide-circuit transitions involve the drawbacks of the performance being degraded due to the use of RF-bond wires, as a result of which packaging problems arise, and e.g. resonances occur, and antennas and transmission lines suffer from high losses.

Flip-chip connections also suffer from several disadvantages. Due to the lack of a carrier, they cannot be easily replaced and they are not suitable for manual installation. Still further they require very flat mounting surfaces, which often is difficult to arrange, and sometimes difficult to maintain as the boards are heated and cooled. Further, the short connections are very stiff, so the thermal expansion of the chip has to be matched to the supporting board or the connection may crack. The underfill material acts as an intermediate between the difference in Coefficient of thermal Expansion of the chip and the board.

Connections between a circuit and a transmission line based on flip-chip connections also involve large alignment problems, and misalignment may lead to the integration being ruined.

WO 2014/154232 discloses a transition between an SIW (Substrate Integrated Waveguide) and a waveguide interface. However, contact is needed between the metal waveguide and the SIW structure on two sides, requiring soldering or similar. Moreover the structure requires a 90° non-planar setup, which is disadvantageous for several reasons.

US 2014/0091884 shows a transition between an SIW and an air-filled waveguide, which also requires contact between the metal waveguide and the SIW structure on two sides. In addition, a tapering substrate is required which is disadvantageous for fabrication reasons.

In all known devices, replacement of the entire transition is needed if the circuit is damaged.

Thus, several problems are associated with the provisioning of a transition between a circuit, passive as well as active, and a waveguide or an antenna, and, so far, no satisfactory solutions have been suggested.

SUMMARY

It is therefore an object of the present invention to provide a transition arrangement comprising a transition between a circuit arrangement, e.g. an active or a passive circuit arrangement, particularly an SIW, and a waveguide or an antenna or antenna interface, as initially referred to, through which one or more of the above-mentioned problems are overcome. The circuit arrangement may comprise one or more active and/or passive circuits in general, e.g. one or more RF circuits, particularly one or more millimeter wave circuits or sub-millimeter wave circuits or one or more active MMICs (Monolithic Microwave Integrated Circuit) and multiple circuit-to-waveguide transitions for one and the same circuit arrangement, or MMIC.

It is also a particular object to provide a transition, or connection, having a high, optimized, yield which is not affected by bonding onto small bond-pad areas and through which losses due to the presence of bond-wires and galvanic contact can be reduced or avoided.

It is also a particular object to provide a high frequency transition arrangement which is less susceptible to alignment problems, and which particularly allows easy circuit alignment.

It is also a particular object to provide a transition arrangement which is easy and cheap to fabricate, and which allows assembly in a fast and easy manner, for example using a pick-and-place machine.

It is a particular object to provide a transition arrangement which can be used for a large variety of different frequencies, from very low frequencies up to very high frequencies.

A most particular object is to provide a transition arrangement which can be used for different circuit arrangements, passive as well as active, one or more MMICs of arbitrary size, i.e. also large MMICs, and even more generally, circuits of many different kinds including hybrid circuits, RF circuits, operating at millimeter or sub-millimeter wave frequencies.

Another object is to provide a transition arrangement allowing a high radiation efficiency. A further object is to provide a transition arrangement which has a good matching capability.

It is also an object to provide a transition arrangement which is reliable and precise in operation.

Particularly it is an object of the invention to provide a transition arrangement through which the need to use RF bond-wire connections can be avoided or reduced.

Still further a particular object is to provide a transition arrangement between a circuit arrangement and one or more antennas and/or one or more waveguides.

Therefore a transition arrangement as initially referred to is provided which has the characterizing features of claim 1.

Still further it is an object to provide a method for fabricating a transition arrangement having the features of the first part of claim 23 through which one or more of the above mentioned problems are overcome.

Therefore a method as initially referred to is provided which has the characterizing features of claim 23.

Advantageous embodiments are given by the respective appended dependent claims.

It is one particular advantage of the invention that, in implementations comprising a transition between a circuit arrangement and an antenna, with the novel integration concept, interconnection and packaging problems of antennas and ICs are overcome. Furthermore it is an advantage that bond wiring of high-speed signal lines is not needed and e.g. antennas can be made ultra-low-loss (metal-only).

Particularly a transition according to the invention works from very low frequencies up to very high frequencies. If the circuit is provided on an application board, then it may comprise an SIW-transition from the application board to the waveguide. The SIW or the SIWs form part of the circuit arrangement, which can be either on a chip or off-chip, i.e. on an application board.

BRIEF DESCRIPTION OF THE DRAWINGS

The invention will in the following be further described in a non-limiting manner, and with reference to the accompanying drawings, in which:

FIG. 3 is a very schematic, simplified planar view from below of the transition arrangement shown in FIG. 1, FIG. 8A is a schematic illustration of a transition arrangement comprising a transition between an antenna and a circuit arrangement according to the invention, FIG. 8B is a schematic illustration of the transition arrangement in FIG. 8A in a position for assembly.

DETAILED DESCRIPTION

Figure 1:
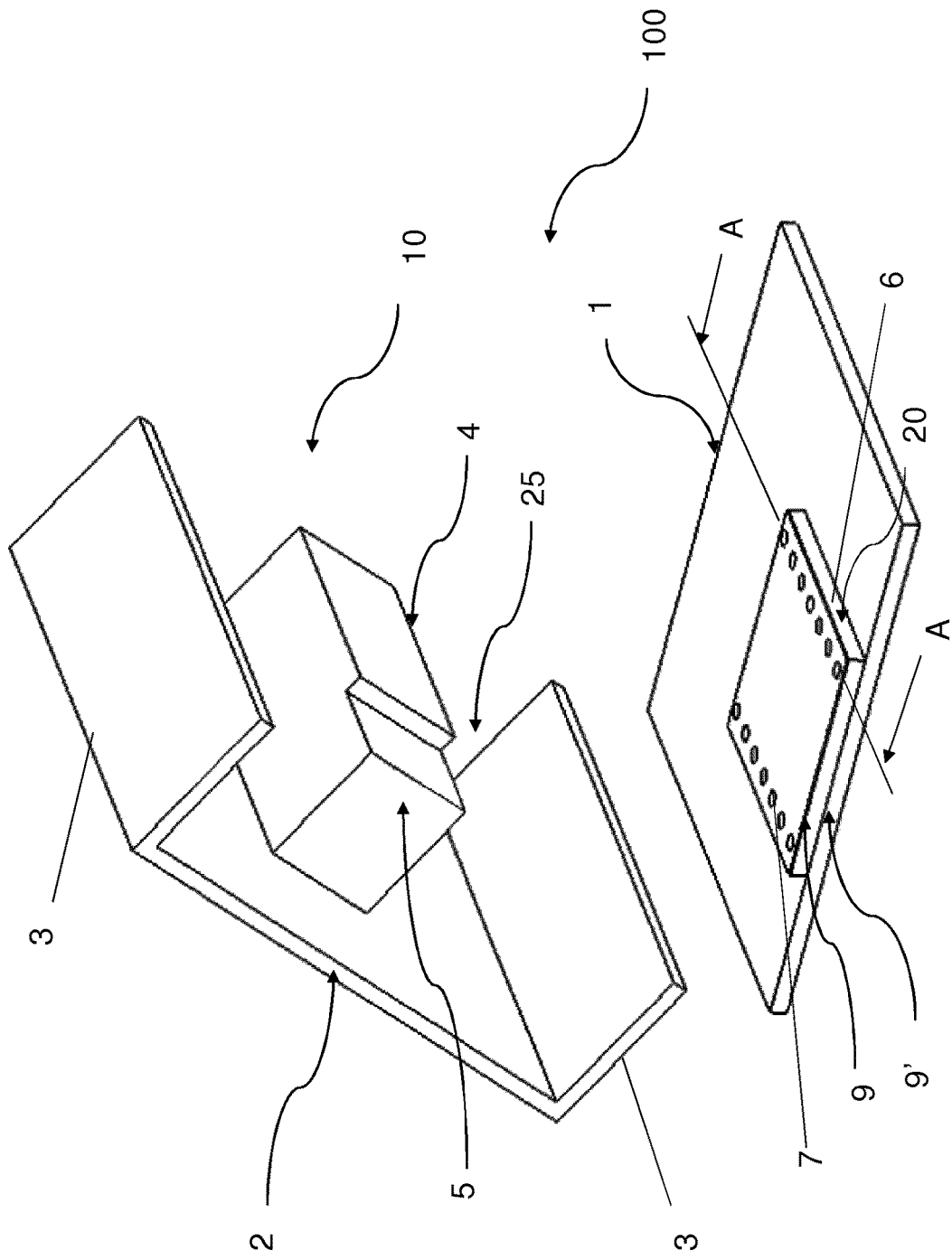
FIG. 1 is a view in perspective of a transition arrangement according to a first embodiment of the present invention.

FIG. 1 schematically illustrates a transition arrangement 100 according to a first embodiment of the invention comprising an SIW (Substrate Integrated Waveguide) ridge-waveguide transition or connection. The transition arrangement 100 comprises a rectangular waveguide 10 which comprises a first conducting, e.g. metal, plate 1 (here a bottom metal plate), a second conducting, e.g. metal, plate 2 (here a top metal plate) and longitudinal conducting, e.g. metal, side walls 3,3 connected to the second (top) conducting metal plate 2. In the following the plates and the walls are referred to as conducting plates or metal plates for reasons of simplicity.

The rectangular waveguide 10 further comprises a ridge 4 which here extends between, and in parallel to, the metal walls 3,3 in a section of the second metal plate 2 of the rectangular ridge waveguide 10. An SIW 20 is attached to the first metal plate 1, here at an end section thereof, opposite to the side or section of the second metal plate 2 where the ridge 4 is located such that, when the first and second metal plates 1,2 are assembled, here interconnected or mounted, e.g. by means of screws or any other appropriate connecting elements (not shown), an inner end section of the SIW 20 will be located such as to face a stub 5 forming an extension of the ridge 4, but here being of a smaller height. The SIW 20 is so located that a slight distance, e.g. corresponding to an air gap, is provided between the SIW 20 upper surface facing the stub 5 and the stub 5 and so that it ends adjacent, at a slight distance, e.g. corresponding to an air gap, from the edge formed at the outer end of the ridge 4, where hence a step is provided between the stub 5 and the ridge 4, for forming the transition. The air gap is an impedance tuning parameter that can be modified, tuned. In one particular embodiment the air gap between the SIW edge and the edge of the ridge 4, i.e. the air gap in a horizontal plane with respect to the plane of the PCB or similar, may be in the range of $0.003\lambda$-$0015\lambda$, $\lambda$ being the wavelength of the centre frequency of the relevant frequency band, and the air gap between the SIW 20 and the stub 5 (the air gap in the normal plane with respect to the plane of the PCB or similar) may be in the range of $0.01\lambda$-$0.021\lambda$. It should however be clear that the figures of these dimensions are merely given for exemplifying reasons and by no means limiting purposes for a particular embodiment and can be larger as well as smaller, and can be modified, tuned, for different structures. The length of the stub 5 corresponds to $\lambda_g/4$, $\lambda_g$ being the guide wavelength of the waveguide section formed by the stub 5 and the metallization (an SIW first ground plane) 9. Typically $\lambda_g$ is associated with a frequency in the centre of the operational bandwidth.

The SIW 20, forming part of, or comprised by, a circuit arrangement (not illustrated, and as such not forming part of the invention) comprises a dielectric substrate 6 with a plurality of metal vias 7 and two, a first and a second, SIW ground planes 9,9' which are connected through the vias 7, wherein the second, in the shown embodiments, bottom, SIW ground plane 9' is connected to the first conducting plate 1. The dielectric substrate typically has a thickness of e.g. 10-100 μm, and, if the circuit is provided on a chip, preferably has a high permittivity, e.g. 10-13, although these figures by no means are given for limitative purposes; they may be higher as well as lower. If, on the other hand, the circuit arrangement is disposed on an application board, the substrate may have a low permittivity, e.g. down to 2-3. However, the inventive concept is not limited to any specific permittivity of the dielectric substrate of the SIW. The SIW is a part of a circuit arrangement, which can be provided either on the chip, or off-chip, i.e. on an application board (not shown).

Figure 4:
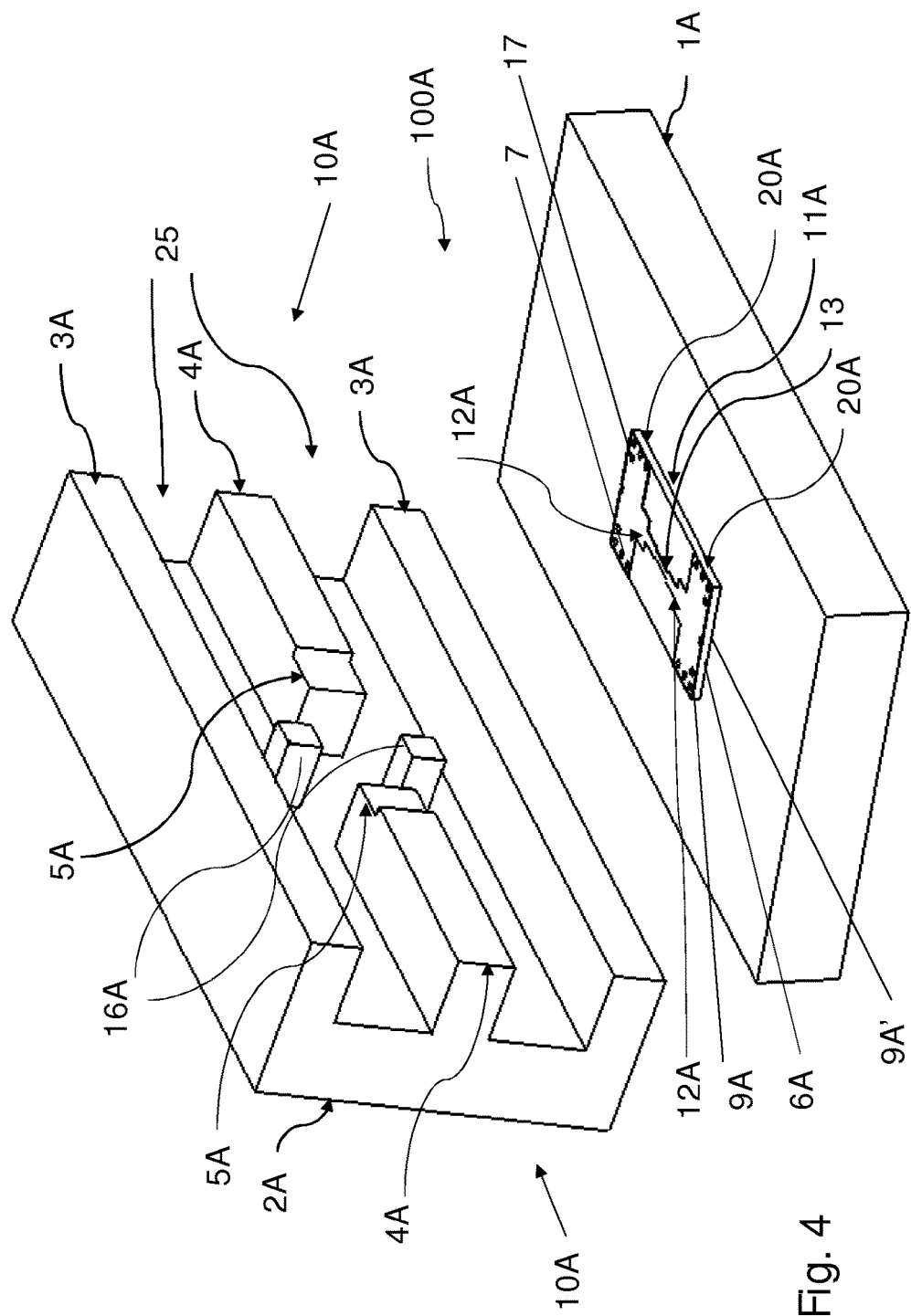
FIG. 4 is a view in perspective showing another embodiment of a transition arrangement according to the invention.

Also additional matching vias may optionally be provided, not shown in FIG. 1 but shown e.g. in FIG. 4, which however are not necessary for the functioning of the inventive concept, but advantageous in so far that they contribute to impedance tuning and improvement of the performance over the bandwidth.

SIW 20, which comprises an SIW waveguide which here is provided on a chip or similar comprising any a circuit arrangement (not shown in FIG. 1), and serves the purposes of acting as a waveguide of the circuit arrangement and of the stub 5. The SIW 20 is e.g. used to feed the circuit. Hence, there is also a transition or an interface between the chip or the circuit and the SIW, commonly a microstrip, or e.g. a co-planar waveguide, but this will not be further described with reference to FIG. 1, since such transitions are known in the art and do not form part of the basic inventive concept, which is concerned with the transition between, here, the waveguide 10 and the SIW 20.

In alternative embodiments, not shown, the chip may be provided on an application board, which is a conventional PCB hosting the chip or naked die. Thus, according to the invention the SIW structure can be arranged on a chip or a naked die itself (high frequency applications), or on a carrier PCB (low frequency applications). When the chip is arranged on the chip, there is no need for any RF-bonding, whereas if it is arranged on a low permittivity application board, e.g. a carrier substrate, RF-bonding is needed for bonding it to the high permittivity chip but not from the SIW on the application board to the waveguide.

Through the additional stub 5, arranged as an extension of, or forming part of, the ridge 4, the open-ended stub impedance is converted into an equivalent short-circuit at the ridge where ridge 4 and stub 5 join, providing a coupling of the electromagnetic field between the SIW 20 waveguide and the ridge (part) 4 of the rectangular waveguide 10. A waveguide input port 25 is schematically indicated. The stub 5 can also be said to comprise two conductors, the stub 5 and the first SIW ground plane 9, i.e. the stub 5 supports an EM field mode in-between two conductors, namely the ridge 5 and the SIW ground plane 9.

According to the invention at least a quasi-planar, contactless transition or connection is provided between the SIW 20 and the ridge 4 of the second conducting plate 2, the second ground plane 9' of the SIW 20 being connected to the first conducting plate 1. The transition is at least quasi-planar in so far that the width is larger than the height, and it is not a 90° setup. The two parts, the first metal plate 1 comprising the SIW 20 and all electronics, and the second metal plate 2 comprising the ridge 4 and the stub 5 are to be placed on top of, facing, each other such that the transition between the SIW 20 and the ridge 4 of the rectangular waveguide 10 is formed as discussed above.

Figure 2:
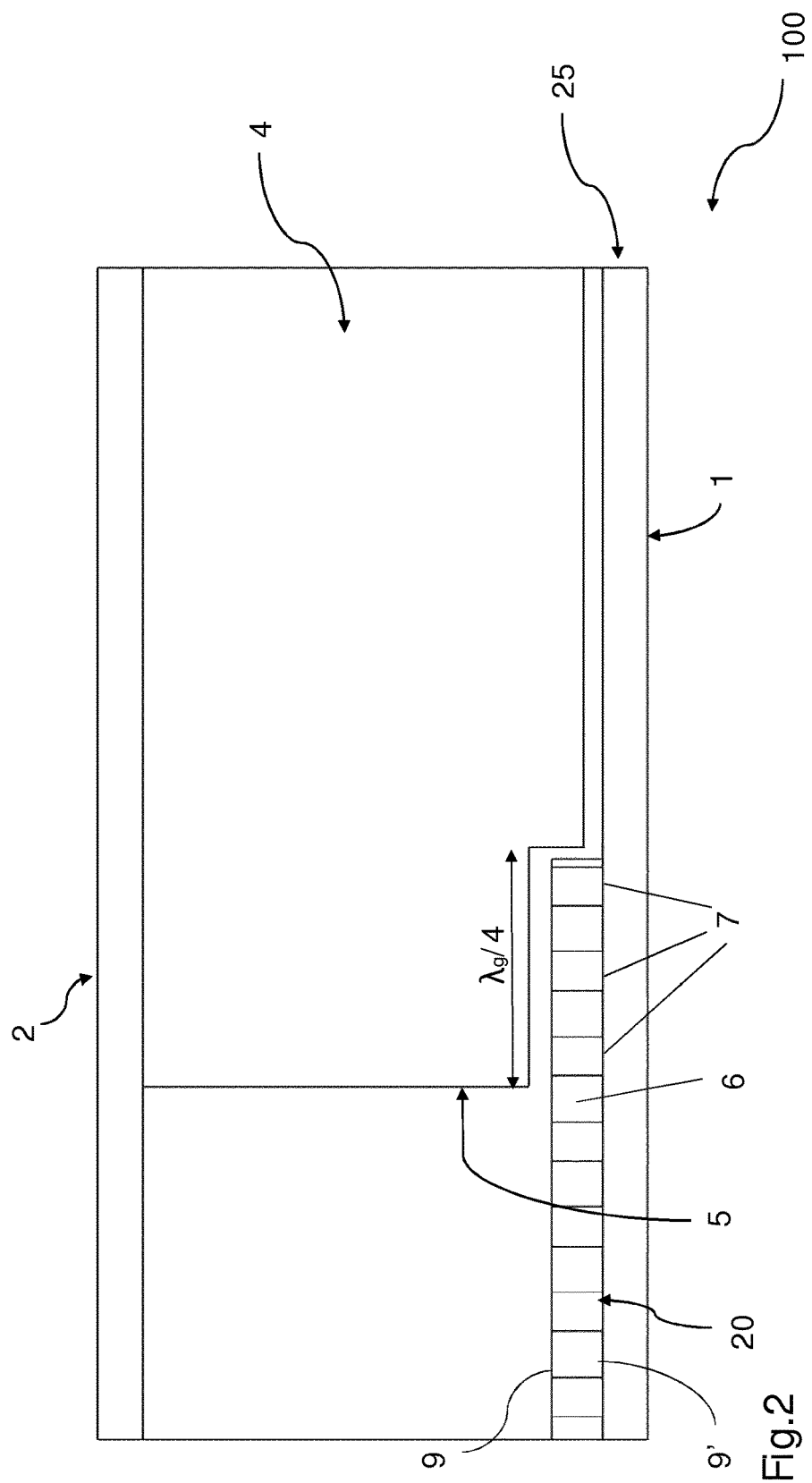
FIG. 2 is a cross-sectional side view of the transition arrangement of FIG. 1.

FIG. 2 is a cross-sectional side view of the transition 100 shown in FIG. 1 taken along a line indicated A-A in FIG. 1, but for the transition arrangement in an assembled, here mounted, state wherein the first and second metal plates are connected by means of fastening means, e.g. screws or similar. In the shown embodiment the SIW 20 (second ground plane 9') is attached to the first (bottom) metal plate of the rectangular waveguide 10. The waveguide ridge 4 is associated with the second, top, metal plate 2 and ends at a slight distance from an inner edge of the SIW 20 in an assembled, here mounted, state of the waveguide, i.e. such that there is an air gap between the ridge 4 and the SIW 20. The ridge 4 extended by means of the $\lambda_g/4$ stub 5 protrudes such as to cover part of the SIW 20, at a slight distance therefrom, i.e. providing an air gap as discussed above, such that the contactless transition is provided.

The first SIW ground plane 9 serves as a common ground plane for the SIW 20 and the stub 5, and the second SIW ground plane 9' serves as a common ground plane for the SIW and a waveguide or an antenna. In FIG. 2 are also shown the vias 7 of the SIW 20, the SIW first ground plane 9. As also mentioned above, according to the invention the stub 5 can also be said to comprise two conductors, namely stub 5 itself and the first SIW ground plane 9 acting as its ground plane.

It should also be clear that, alternatively, the SIW 20 may be attached to the second or top metal plate 2 instead, in which case the ridge 4 and the stub 5 have to be on the first, opposite, conducting plate 1. It should further be clear that the metal walls 3,3 can be associated with any one of the first or second metal plates 1,2. Moreover it should be clear that, in alternative embodiments, there may be more than one ridge, e.g. several ridges, e.g. arranged to be located in different directions, with each a quarter wave-length stub to provide two- or multiport devices.

Generally, the contactless transition from the ridge 4 of the waveguide 10 to the SIW structure 20 inside the waveguiding structure provided by means of stub 5 (and SIW ground plane 9; which actually is part of the SIW) matching can be implemented in many different manners, and generally it can be applied N times to feed a chip with a circuit, thus comprising N SIW-to-waveguide transitions of the type discussed above leading to an N-port device. The ridges then go out in various different directions from the chip.

Figures 2A, 2B:
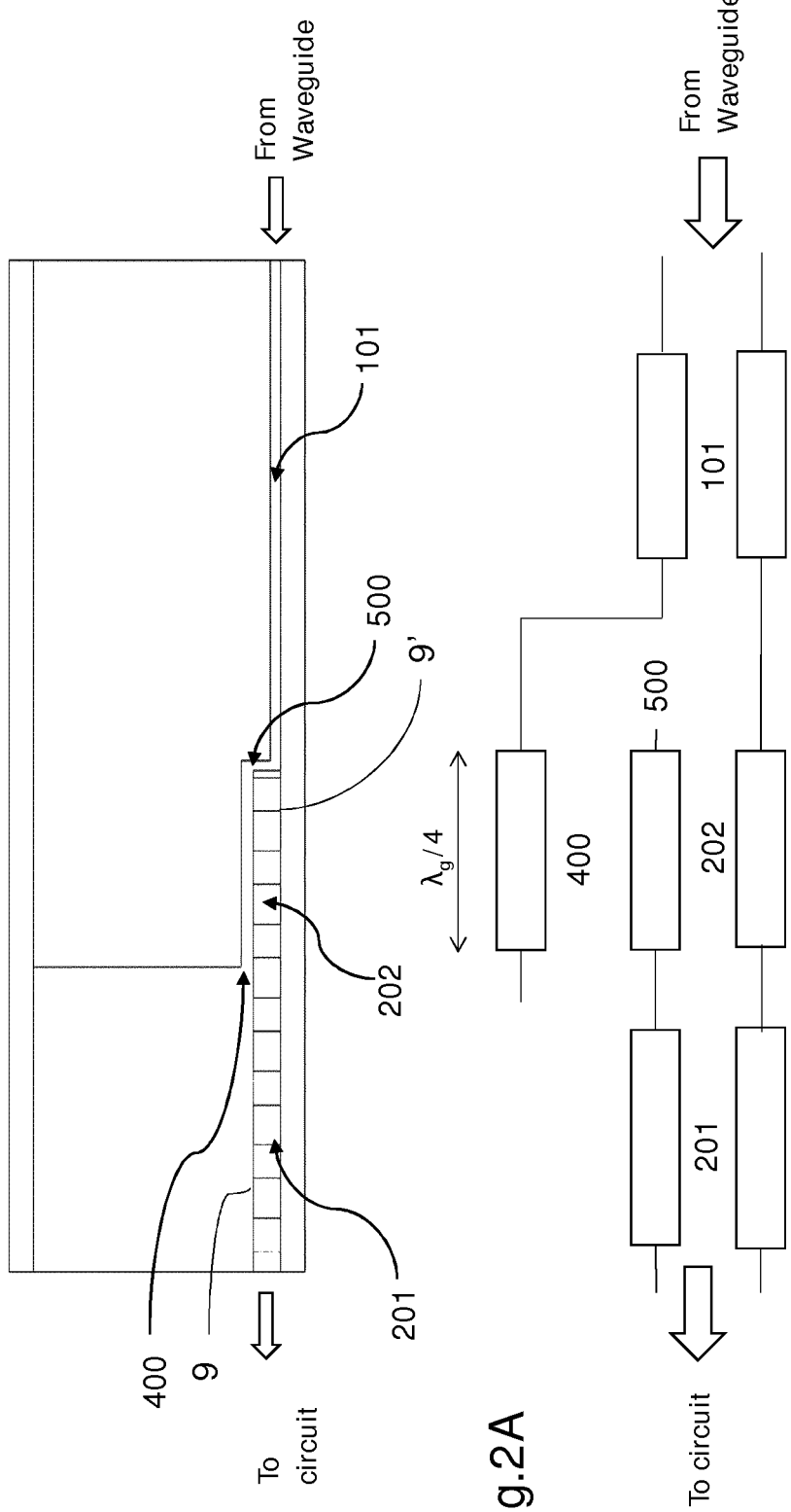
FIG. 2A is a schematic section model of the transition arrangement shown in FIG. 1.
FIG. 2B is a simplified schematic single-mode transmission line network model of the section model of FIG. 2A.

FIG. 2A is view similar to FIG. 2, but wherein the different elements are represented as sections also schematically illustrated in the simplified single-mode transmission line network model of FIG. 2B for explanatory reasons.

Thus, in FIGS. 2A and 2B, reference numeral 101 represents a ridge rectangular waveguide, reference numeral 201 is taken to represent the SIW 202 and stub ground plane for a section representing the quarter wavelength open-ended stub section 400. One of the conductors of the ridge rectangular waveguide 101 becomes connected to the bottom conductor of the SIW 201, while the upper conductor of SIW 201 forms the bottom ground plane of the open-ended stub section 400 which transforms the reference numeral 500 effectively from an open circuit to a short circuit, so that an electrical connection between 101 and 201 is effectuated.

Referring to FIG. 2, this can be expressed as there being two paths for the EM-field; namely a first path directly inside the dielectric substrate, SIW 20, which then passes on to the path in-between ridge 4 and the first conducting plate 1, as well as a second path in-between stub 5 and the first SIW ground plane 9. The second path is open, completely mismatched at its end, so that the field is reflected, and joins the field having taken the first path, i.e. adds on to the field of the first, straight going, path, and then proceeds onto the waveguide in-between ridge 4 and the first conducting plate 1. The field can be said to jump from (or into) the SIW or the chip without being reflected. The electromagnetic waves thus are guided from the waveguide into the substrate (SIW) without any galvanic contact between the first SIW ground plane 9 and the ridge 4 and the stub 5.

Figure 2C:
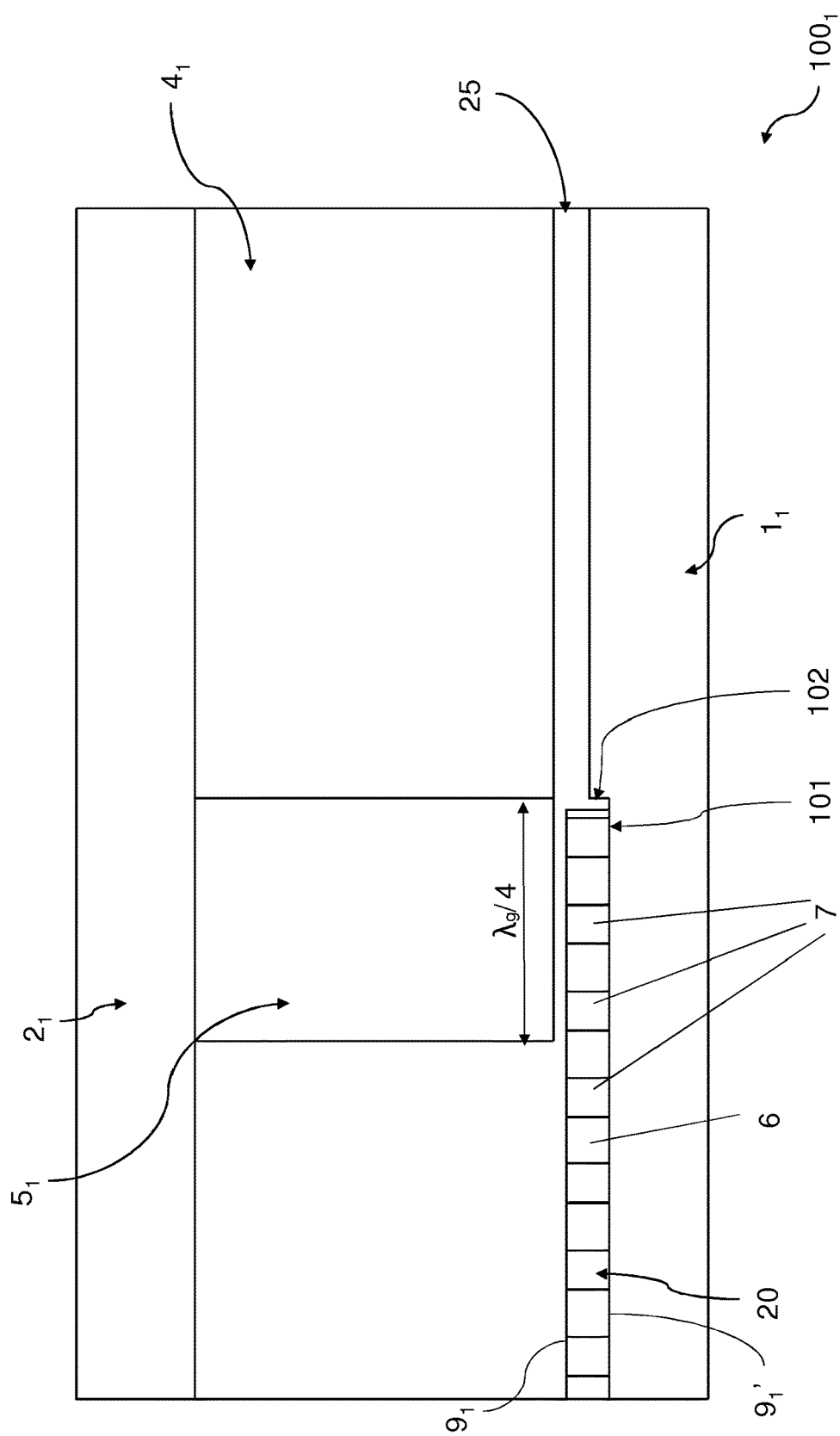
FIG. 2C is a cross-sectional side view of an alternative embodiment of a transition arrangement according to the invention.

FIG. 2C shows an alternative embodiment of a transition between an SIW 20 and a ridge waveguide. The SIW 20 is placed and connected inside a groove 101 provided in the first conducting plate $1_1$, or e.g. the bottom ground plane, and is located at a slight distance, comprising an air gap, from a groove edge 102, which edge 102 here is substantially perpendicular to a longitudinal extension of the first conducting plate or block $1_1$. It should however be clear that the edge 102 may also form an angle with the planar extension of the first plate 1, or e.g. taper linearly or exponentially. Many alternatives are possible. The EM field needs to propagate from a port 25 to the SIW 20 or vice versa without being obstructed, since obstructions may lead to impedance mismatch effects causing a reduced bandwidth, the airgap hence facilitating the transition, the SIW substrate not being blocked.

The electromagnetic field in the ridge waveguide will couple to the SIW 20 by means of $\lambda g/4$ stub $5_1$, which converts the open-ended impedance to an equivalent short-circuited impedance. In other respects the functioning is similar to that described above with reference to FIGS. 1-2B and will therefore not be further described here. Similar elements bear the same reference numerals. FIG. 3 is a schematic bottom view of the transition arrangement 100 of FIG. 1 with the first, bottom, metal plate 1 removed for illustrative purposes. It can be seen how the ridge 4 ends adjacent the SIW structure 20 and how the $\lambda g/4$ stub 5 (dashed line) extends across part of the SIW structure 20, hence providing the planar contactless transition or contactless connection interface between ridge 4 and the SIW 20. The other elements have already been discussed above with reference to FIGS. 1 and 2, and will therefore not be further discussed here.

FIGS. 1-3 show a single port transition package; it should also be clear that it could be symmetrical, with a stub arranged also at the other end of the ridge, with a common SIW or also e.g. one or more further SIWs, for example forming a two-port or a multi-port device.

FIG. 4 shows an embodiment of a transition arrangement 100A comprising, here, two contactless back-to-back microstrip line-to-waveguide transitions, each comprising a contactless transition between a ridge 4A of a ridge waveguide 10A and a SIW structure 20A comprised in a circuit arrangement 11A provided on a chip (or application board). The transition arrangement 100A comprises a first metal plate 1A to which a chip with a microstrip integrated circuit 11A comprising two SIWs 20A,20A is attached.

Each SIW 20A comprises a dielectric substrate 6A with a first SIW ground plane 9A and a second SIW ground plane 9A' on either sides thereof and through which a plurality of vias 7 run as also discussed above with reference to FIG. 1. The chip or circuit arrangement 11A comprising the SIWs 20A,20A is illustrated with two SIW-to-microstrip transitions 12A,12A between a respective SIW 20A and the circuit arrangement 11A, wherein the microstrip lines are interconnected by means of a circuit 13 comprising two on-chip interface ports and active components, which however will not be further discussed herein, since the inventive concept is concerned mainly with the transitions between the respective SIW 20A and the respective ridge 4A of the ridge waveguides 10A,10A as discussed above.

The transition arrangement 100A also comprises a second metal plate or waveguide block portion 2A comprising a ridge waveguide arrangement with two ridge waveguides 10A,10A disposed between two longitudinal wall sections 3A,3A disposed in parallel, the ridge 4A of each ridge waveguide 10A ending at a location adjacent the outer end of a respective SIW structure 20A in an assembled or mounted state of the two metal plates or waveguide block portions 1A,2A. Each ridge 4A,4A is extended by means of a quarter wavelength stub 5A,5A as discussed with reference to FIGS. 1-3 above. It should be clear that even if only stubs with a rectangular shape are explicitly shown, the inventive concept also covers stubs with a triangular shape, a sector shape or any other appropriate shape. The stubs 5A,5A here have a height which is somewhat lower than that of the respective ridges 4A,4A. Here short-circuited pins 16A,16A (optional) are provided adjacent the $\lambda g/4$ stubs 5A,5A, at the outer free ends thereof pointing away from the respective ridges 4A,4A of the ridge waveguides 10A,10A, and transversally displaced with respect to one another to prevent EM-field leakage so that the fields from the waveguide will be coupled to the chip, i.e. no field will propagate underneath the chip and create a cavity. The short circuit pins 16A may further prevents the fields from passing through directly in a back-to-back configuration, which is not desired since the fields must follow the paths from ridge 4A to SIW 20 and back again. Passing through directly increases the feedback and thus decreases the input to output isolation in e.g. amplifier circuits, thus causing oscillations. Thus, pins 16A may also avoid the circuit arrangement and the transition from exciting spurious, undesired, modes close to the circuit which, when inside a cavity, create cavity resonances. Generally, in all embodiments the short circuit pins are optional, but if they are included, they are arranged so as to connect the first and second conducting plates.

Optionally, additional vias 17 as discussed with reference to FIG. 1 above may be provided. A waveguide input port 25, referring to the whole aperture opening, is schematically indicated.

As in the embodiment described with reference to FIGS. 1-3, the metal plates or waveguide block portions 1A,2A are to be assembled, here mounted, and releasably secured to each other in any appropriate manner. Through the arrangement of the present invention, the circuit arrangement 11A comprising the SIWs, e.g. a PCB, may easily be replaced, e.g. in the case of malfunctioning or if it is ruined, or simply if it should be exchanged through another chip or circuit arrangement with different properties.

The inventive concept is as also indicated above applicable to any kind of circuit arrangement, e.g. a high (RF) frequency package comprising a circuit arrangement, such as an MMIC (Monolithic Micro/Millimeter-wave Integrated Circuit) or any other circuit arrangement, e.g. wherein one or several MMICs or hybrid circuits are connected, or mounted on a carrier and interconnected, or in general one or more circuits, active or passive, in the following also simply denoted "circuit", and to chips disposed on an application board, i.e. the SIW may be disposed on a chip or a naked die itself, or disposed on a carrier substrate. Thus, the circuit arrangement may comprise an application board with a naked die holding an active semiconductor circuit, active components, schematically indicated 13 in the figures, where there are two on-chip interface ports, or it may represent a high permittivity naked die as a whole including the SIWs 20A, microstrip-to-SIW transitions 12A and doped semiconductors at 13 (not shown).

Figure 5:
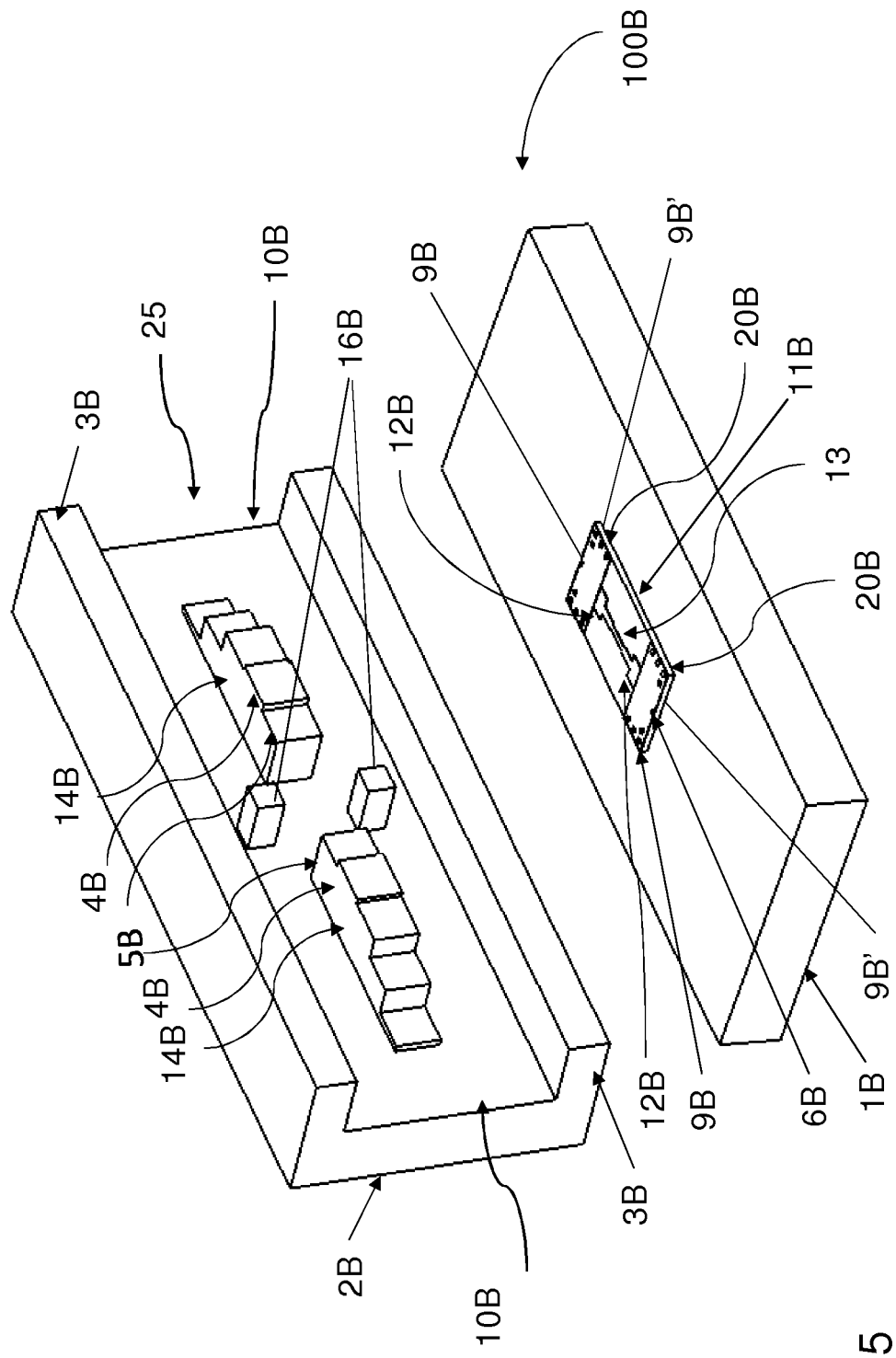
FIG. 5 is a view in perspective showing still another embodiment of a transition arrangement according to the invention.

FIG. 5 shows an embodiment of a transition arrangement 100B comprising, here, two back-to-back microstrip line to waveguide transitions, each comprising a contactless transition between a ridge waveguide structure 14B,14B of a rectangular waveguide 10B,10B and an SIW structure 20B comprised in a circuit arrangement 11B of a chip or application board comprising SIW-to-microstrip transitions 12B, 12B in-between SIWs 20B,20B and the microstrip line connecting the circuit components. The transition arrangement 100B comprises a first metal plate or waveguide block portion 1B to which a chip (or an application board holding the chip) with a microstrip integrated circuit 11B comprising SIWs 20B,20B is attached. The attachment of the circuit arrangement 11B comprising the SIWs 20B,20B to either one of the conducting, metal, plates or waveguide blocks 1B,2B, of the SIW-to-waveguide transitions based on λg/4 stubs 5B,5B to the respective opposite conducting, metal plate, as well as other elements relevant for the functioning of the inventive concept have already been described with reference to FIG. 1, FIG. 3 and FIG. 4.

The circuit arrangement 11B comprising the SIWs 20B, 20B and the SIW-to-microstrip transitions 12B,12B between the respective SIW 20B,20B and the circuit 11B are not further discussed herein, since the inventive concept is concerned mainly with the transition between the respective SIWs 20B,20B and the waveguides 10B,10B of the, here, rectangular waveguide arrangement, and since the SIW-to-microstrip transitions have been discussed above with reference to FIG. 4, similar elements bearing the same reference numerals but with an index "B".

The second metal plate or waveguide block portion 2B of the transition arrangement 100B comprises two impedance transformers comprising stair sections 14B,14B, each comprising a number of steps (here three-step Chebyshev transformers) connecting the respective waveguide ridges 4B,4B to the respective rectangular waveguide arrangement 10B ending with a respective waveguide port 25 of which one is very schematically illustrated in FIG. 5, i.e. at a location adjacent a respective outer end of the respective SIW structure 20B,20B in an assembled, here mounted, state of the two metal plates or waveguide block portions 1B,2B. To provide for the contactless transitions, each ridge 4B,4B comprising or connecting to a transformer section 14B,14B is extended by means of a quarter wavelength stub λg/4 5B,5B located adjacent the ridge 4B,4B similar to the transition arrangements described with reference to the preceding embodiments, with the difference that the λg/4 stubs 5B,5B are located adjacent, or as extensions of, the ridges 4B,4B of the respective transformer sections 14B, 14B. Said stubs 5B,5B have a height which is somewhat smaller than that of the ridges 4B,4B.

The first and second waveguide blocks 1B,2B may comprise standard-flange waveguide matching steps (not shown). Short-circuited pins 16B,16B are provided adjacent to the stubs 5B,5B, at the outer free ends pointing away from the respective waveguide ridges 4B,4B of or connecting to the respective transformer section 14B,14B, and transversally displaced with respect to one another to prevent EM-field leakage as already discussed above with reference to FIG. 4.

Also as in the embodiments described with reference to FIGS. 1-3 and 4, the waveguide blocks or metal plates 1B,2B are to be assembled, mounted, and releasably secured to each other in any appropriate manner. The chip or the circuit arrangement 11B comprising the SIWs 20B,20B may easily be replaced e.g. in the case of malfunctioning or if it is ruined, or if it should be exchanged through another chip or circuit arrangement with different properties or serving another purpose.

In other respects the functioning is similar to that described above with reference to the embodiment of FIG. 4, and other preceding embodiments, and will therefore not be further discussed herein, similar elements bearing the same reference numerals, but being provided with an index "B".

Figure 6:
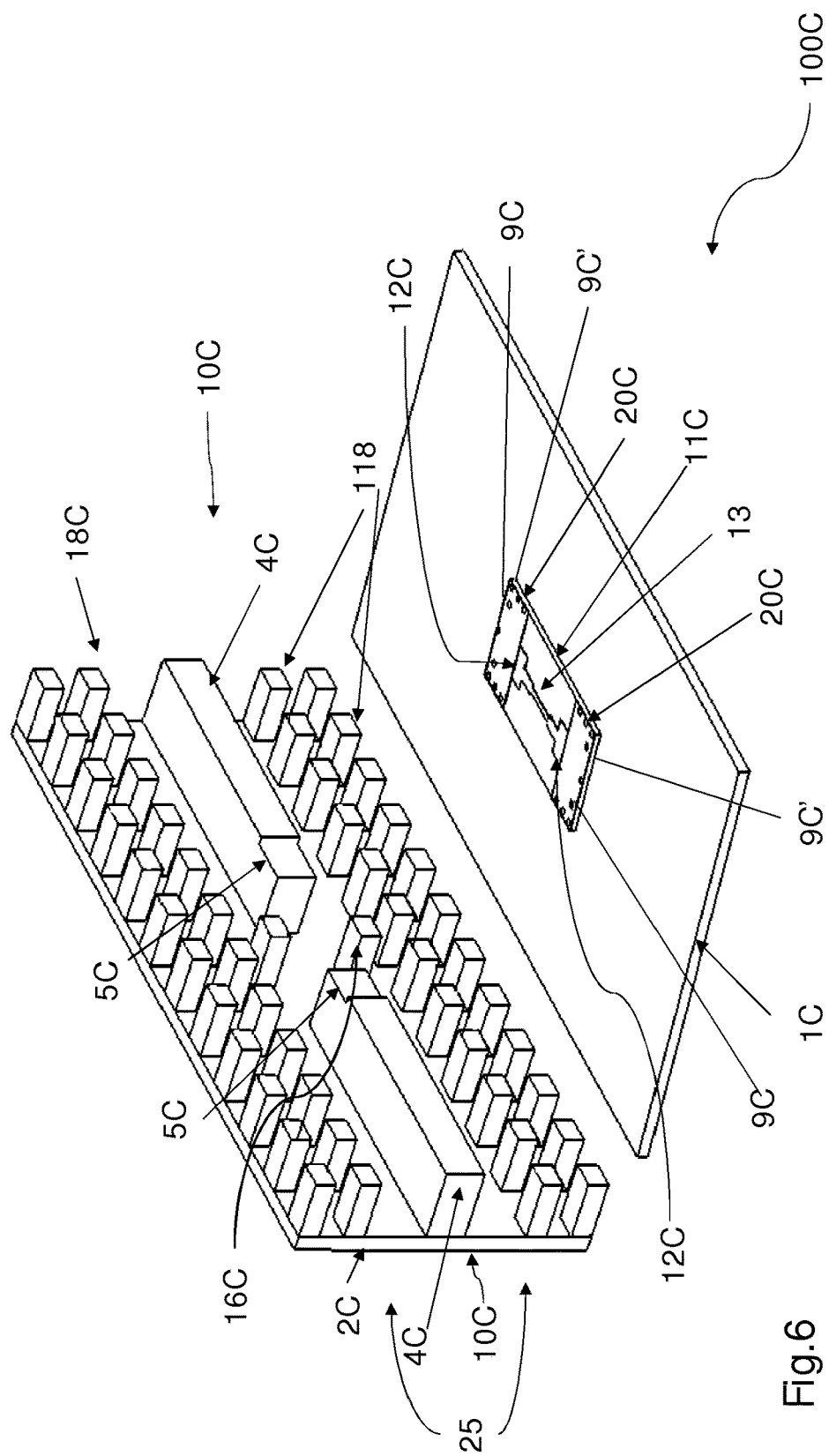
FIG. 6 is a view in perspective showing still another embodiment of a transition arrangement according to the invention.

FIG. 6 shows an embodiment according to the invention comprising a microstrip integrated circuit to ridge gap waveguide back-to-back transition arrangement 100C. The EM-field from microstrip lines of the circuit arrangement 11C, e.g. a PCB, is electromagnetically coupled to, here, two symmetric ridge gap waveguides 10C,10C using the intermediate steps comprising the inventive transition between the waveguide of the SIWs 20C,20C and the ridge gap waveguides 10C,10 maximizing the EM-field transmission. The transition, as also referred to above, can be said to be divided into a first and a second part, wherein the first part comprises the circuit part, the circuit arrangement, 11C, e.g. a PCB, and comprises the microstrip-to-SIW transitions 12C,12C, the circuit arrangement 11C comprising the SIWs 20C,20C and being attached to the first, here bottom, metal plate 1C of the ridge gap waveguides 10C,10C. This first part of the, or each, transition is straightforward and e.g. comprises step-tapered microstrip line sections connecting a 50Ω microstrip line to the SIWs used to transform the Quasi-TEM microstrip line to the TE10 mode in the SIWs 20C,20C. However, as already discussed above, the invention is not limited to any particular transition between the circuit arrangement 11C and the SIWs 20C,20C.

The second part of the, or each, transition, to which the invention is specifically directed, comprises the transitions between the SIWs 20C,20C and the ridges 4C,4C of the ridge gap waveguides 10C,10C. The additional λg/4 stubs 5C,5C serve the purpose of providing an electromagnetic coupling of the EM-field between the SIW 20C,20C waveguides and the ridges 4C,4C of the ridge gap waveguides 10C,10C by inverting the impedance and creating short circuits, hence providing contactless transitions.

In the embodiment shown in FIG. 6, the waveguides 10C,10C comprise so called gap waveguides comprising a periodic or quasi-periodic structure 18C e.g. formed by a plurality of metallic pins 118 extending substantially perpendicularly to, here, the second metal plate or the second waveguide block 2C, and being arranged to face the circuit arrangement 11C comprising the SIWs 20C,20C. The pin structure 18C comprising a pin bed replaces the metal waveguide walls 3,3A,3B in the preceding embodiments, and in such gap waveguide structures the first and second metal plates 1C,2C are disconnected, i.e. not joint, and there is no need for any screws or other connecting means. Thus, in such gap structures, see e.g. FIGS. 6,7,8A,8B, the first and second conducting plates, blocks or similar are assembled, without requiring being properly mounted or interconnected e.g. by means of appropriate fastening means, as e.g. the arrangements shown in FIGS. 1-5. Further, gap structures are advantageous when mechanical tolerances are an issue, or when connections between waveguide split blocks need to be established, and may also prevent leakage, and thus to stop undesired propagation of waves when packaging circuits. By means of the periodic or quasi-periodic pin structure 18C, waveguide modes are blocked from leaking into the circuit arrangement 11C comprising the SIWs 20C,20C from the ridge gap waveguides 10C,10C. Thus no power in a form of waveguide higher order modes can propagate between the waveguides and the circuit arrangement, and leakage in the transitions will be reduced or prevented.

The plurality of metallic pins 118 are disposed in parallel and each pin may have a circular, rectangular or a square-shaped cross-section and protrude perpendicularly with respect to a planar surface of the second metal plate or waveguide block portion 2C.

In advantageous embodiments, to which the invention is not limited, the width, the cross-sectional dimension, of square shaped pins may be about $0.1\lambda$-$0.2\lambda$, $\lambda$ being the wavelength of the centre frequency of the relevant frequency band, and the height of the pins is about $\lambda/4$, e.g. between $0.15\lambda$ and $0.3\lambda$.

Particularly the period is between approximately 0.25, and $0.4\lambda$.

The distance between the top of the pin surface and the ground plane of the circuit arrangement (here the SIW first ground plane 9C) should in advantageous embodiments be less than $\lambda/4$, although it may be larger as well as smaller.

Since the periodic structure, also denoted texture, is so designed that it stops propagation of waves over a specific frequency band for which it is designed, the shape and dimensions and the arrangement of e.g. pins, are selected correspondingly.

The non-propagating or non-leaking characteristics between two surfaces of which one is provided with a periodic texture (structure), is e.g. known from P.-S. Kildal, E. Alfonso, A. Valero-Nogueira, E. Rajo-Iglesias, "Local metamaterial-based waveguides in gaps between parallel metal plates", IEEE Antennas and Wireless Propagation letters (AWPL), Volume 8, pp. 84-87, 2009. The non-propagating characteristic appears within a specific frequency band, referred to as a stopband. It is also known that such stopbands can be provided by other types of periodic structures, as described in E. Rajo-Iglesias, P.-S. Kildal, "Numerical studies of bandwidth of parallel plate cut-off realized by bed of nails, corrugations and mushroom-type EBG for use in gap waveguides", IET Microwaves, Antennas & Propagation, Vol. 5, No 3, pp. 282-289, March 2011. These stopband characteristics are also used to form so-called gap waveguides as described in WO/2010/003808.

The described periodic or quasi-periodic textures may be used in particular embodiments of a transition arrangement according to the present invention.

In other respects the transition arrangement 100C and its functioning is similar to the transition arrangement described with reference to FIG. 4, and other preceding FIGS. 1-3,5 and will therefore not be further described herein, and similar elements bear similar reference numerals but are provided with an index "C". The short-circuited pins 16C are optional as also referred to above; they may simply also comprise gap pins 18C.

Figure 7:
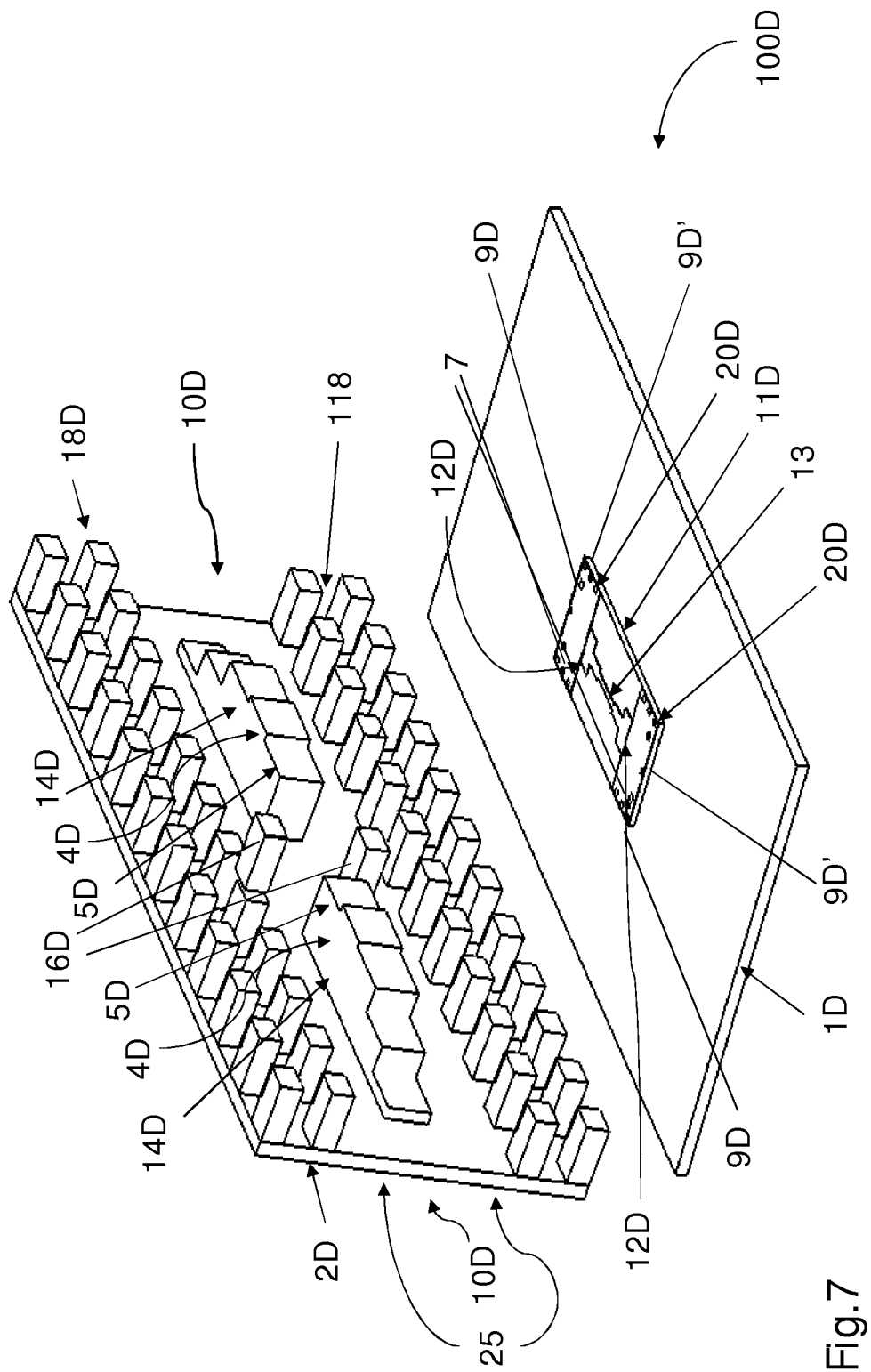
FIG. 7 is a view in perspective showing still another embodiment of a transition arrangement according to the invention.

FIG. 7 shows another embodiment of a transition arrangement 100D comprising a gap waveguide arrangement, more specifically a microstrip IC to groove gap waveguide back-to-back transition arrangement. The E-field from e.g. a microstrip line of the circuit arrangement 11D, e.g. PCB, is electromagnetically coupled to the groove gap waveguides 10D,10D using the intermediate steps comprising the waveguides of the SIWs 20D,20D and the groove gap waveguides 10D,10D to maximize the EM-field transmission. The first parts of the transitions comprising the transitions 12D,12D from microstrip line to SIWs 20D,20D of the circuit arrangement 11D which is attached to the first, here bottom, plate 1D of the gap waveguide arrangement are, as also mentioned above, straightforward and may e.g. comprise step-tapered microstrip line sections connecting a $50\Omega$ microstrip line to the SIW waveguides used to transform Q-TEM microstrip line mode to the TE10 mode in the respective SIWs 20D, 20D and the invention is not limited to any particular first part transition between the circuit arrangement 11D and the SIWs 20D,20D.

The second part of each transition comprises the transitions between the SIWs 20D,20D and the groove gap waveguides 10D,10D.

The transition arrangement 100D (cf. the embodiment described with reference to FIG. 4), in addition to a first metal plate or waveguide block portion 1D, to which the circuit arrangement 11D comprising the SIWs 20D,20D is attached, further comprises a second metal plate or waveguide block portion 2D comprising a groove in which impedance transformer sections 14D,14D are arranged (cf. FIG. 5), each comprising a number of steps (here a three-step Chebyshev transformer) forming a stair connecting ridges 4D,4D of the groove gap waveguides 10D,10D to the groove of the gap waveguide arrangement, ending by a respective waveguide port 25.

To provide the contactless transitions according to the invention, an electromagnetic coupling of the EM-field between the SIWs 20D,20D to the ridges 4D,4D of the gap waveguides 10D,10D respective $\lambda g/4$-stubs 5D,5D are connected to ridges 4D,4D of the gap waveguides 10D,10D to invert the impedance and create a respective short circuit.

Each ridge 4D,4D is thus extended by means of a quarter wavelength stub 5D,5D as also discussed with reference to FIGS. 1-3 above, and in particular with reference to FIG. 5, each stub 5D,5D having a height which is somewhat smaller, lower, than that of the respective ridge 4D,4D such that an air gap is created between the respective $\lambda g/4$-stub 5D,5D and the SIW 20D,20D.

The first and second waveguide blocks 1D,2D may comprise standard-flange waveguide matching steps (not shown). Short-circuited pins 16D,16D may be provided adjacent the stubs 5D,5D as in the preceding embodiments at the outer free ends pointing away from the respective ridges 4D,4D, and transversally displaced with respect to one another to prevent leakage as also discussed earlier in the application. The top (here) metal plate comprises a pin structure 18D comprising a plurality of pins, e.g. a pin bed, 118 or similar as also described with reference to FIG. 6 which will therefore not be further discussed here, and, as described with reference to FIG. 6, the first and second waveguide blocks 1D,2D remain disconnected, not joined, also when assembled.

FIGS. 4-7 in principle all illustrate two-port devices, e.g. for amplifiers, but can be extended to comprise any circuit having various numbers and types of ports. Examples are frequency converters (mixers), power amplifiers, LNAs (Low Noise Amplifiers), signal sources, frequency multipliers and different combinations of such components etc.

The waveguide structures may comprises metal plates or waveguide split block assemblies comprising a first waveguide block portion or a first conducting, metal plate, forming the respective half of one or more waveguides, and a second waveguide block portion or second metal plate forming the respective other half of said one or more waveguides.

In FIGS. 1,4-7 the waveguide assemblies are illustrated in an open, non-assembled (gap structures) or unmounted state.

When the waveguide blocks, or the first and second conducting plates, are connected (mounted or assembled), e.g. one or more waveguides are formed, the split may be along the broad dimension of a rectangular cross-section of the waveguide.

Although in the illustrated embodiments the first conducting, metal, plates or block portions are taken to form a bottom portion, it should be clear that, in alternative embodiments, the metal plate or block portion disposition may be different, e.g. reverted, or the metal plates or waveguide blocks or antenna parts may comprise two metal plates or blocks disposed and formed in any other appropriate way, on condition that the SIW(s) is/are provided on a block or conducting portion opposite to the block or conducting plate comprising e.g. the ridge waveguide(s) extended with the stub(s).

The first and second conducting plates or blocks, e.g. waveguide blocks or antenna parts may, as referred to above, be connected by screws or other fastening means, unless being gap arrangements as e.g. described with reference to FIGS. 6,7,8A,8B, in which case they are merely assembled and truly disjoint, and guiding pins (not shown) may in some embodiments be provided for assuring an accurate positioning of SIWs and stubs enabling the provisioning of the SIW-waveguide transitions according to the invention.

The invention is, as also referred to above, not limited to any specific circuitry, and supporting electronics is not shown for reasons of clarity and since it does not form part of the main inventive concept.

The first conducting plate is adapted to host said circuit arrangement comprising the SIW or the SIWs, and may e.g. comprise one or more receiving cavities. In alternative embodiments the circuit arrangement comprising the SIW or the SIWs is, preferably releasably, mounted onto the first (or second) block portion or conducting plate in any other appropriate way, e.g. by soldering, welding, gluing or similar.

In general, the two-port back-to-back structures can be used in many different ways. For example, when a circuit is hosted on a PCB/chip, one waveguide port can be used as an input, and if the chip hosts an amplifier, the other waveguide port can be left open to radiate the field as an open-ended waveguide. Hence, it represents an antenna with integrated electronics. As another example, the back-to-back structure may in principle represent any other type of non-radiating active or passive two-port device.

In particular embodiments of the present invention the transition arrangement comprises a transition between a circuit arrangement of any kind as discussed above and an antenna, some examples of which are given in FIGS. 8A,8B and 9 below. Except for the/a waveguide being substituted by an antenna, the functioning and the involved elements are similar and can be of different kinds as discussed with reference to the waveguide embodiments shown in FIGS. 1-7, and will therefore not be described in further detail herein.

Particularly it may be an antenna structure based on the ridge concept as disclosed in FIG. 4 or an antenna structure based on a rectangular concept as disclosed in FIG. 5, and it may also be a an antenna structure comprising a gap waveguide as described e.g. in FIGS. 6 and 7 above. Features and elements having been discussed and shown already with reference to preceding embodiments are hence not further discussed with reference to the antenna implementations of FIGS. 8A,8B and 9, and are indicated through the same reference numerals, but bearing an additional index "E" and "F" respectively.

FIG. 8A shows a transition arrangement 100E according to the invention comprising a microstrip integrated circuit to ridge slot antenna transition. The transition is based on electromagnetic coupling of the EM-field from e.g. a microstrip line 12C of the circuit arrangement 11E, e.g. a PCB, to the ridge gap antenna 10E using the intermediate steps comprising the transition between the SIW 20E and the antenna 10E to maximize the EM-field transmission.

As also discussed above, the transition between the SIW 20E and the circuit part, e.g. a PCB, comprising the transition from microstrip 12E to the SIW 20E directly attached to the first, here bottom, metal plate 1E is straightforward and the invention is not limited to any particular transition between the circuit arrangement 11E and the SIW 20E.

The second part of the transition, to which the invention is specifically directed, comprises the transition between the SIW 20E and the slot antenna 10E.

In the embodiment shown in FIG. 8A, showing the arrangement 100E in an open, not assembled, state, the antenna 10E comprises a so called gap waveguide slot antenna comprising a periodic or quasi-periodic structure 18E e.g. formed by a plurality of metallic pins 118 extending substantially perpendicularly to the second metal plate 2E forming e.g. a bed of pins, and arranged to face the circuit arrangement 11E comprising the SIW 20E provided on the first metal plate 1E. The first metal plate 1E also comprises an antenna slot 115. The pin structure 18E is similar to the pin structure described with reference to FIGS. 6 and 7, but implemented for an antenna, and will not be further described here. It should be clear that it can be varied as discussed with reference to FIGS. 6 and 7.

The second metal plate 2E comprises a feeding ridge 4E with a $\lambda_g/4$ stub 5E connected to the free end of the ridge 4E. The $\lambda_g/4$ stub 5E, as also discussed above, serves the purpose of providing an electromagnetic coupling of the EM-field between the SIW 20E waveguide and the ridge 4E of the ridge gap waveguide slot antenna 10E, effectively creating a short-circuit, and hence providing a contactless transition. For illustrative purposes, the second metal plate is not shown to scale with the first metal plate.

The feeding ridge 4E comprises a T-section 116 adapted for exciting the slot 115 in the first metal plate 1E. The SIW 20E may optionally be provided with tuning means 17 comprising vias and a notch for the purposes of impedance tuning, which however are not necessary for the functioning of the inventive concept.

FIG. 8B shows the transition arrangement 100E of FIG. 8A in a state in which the first and second metal plates 1E,2E are to be assembled, i.e. here the second plate 2E is shown in an elevated assembling position above the first metal plate 1E, such as to provide a contactless transition and the T-section 116 is disposed above the slot 115. The microstrip input port 19E is schematically indicated.

Figure 9:
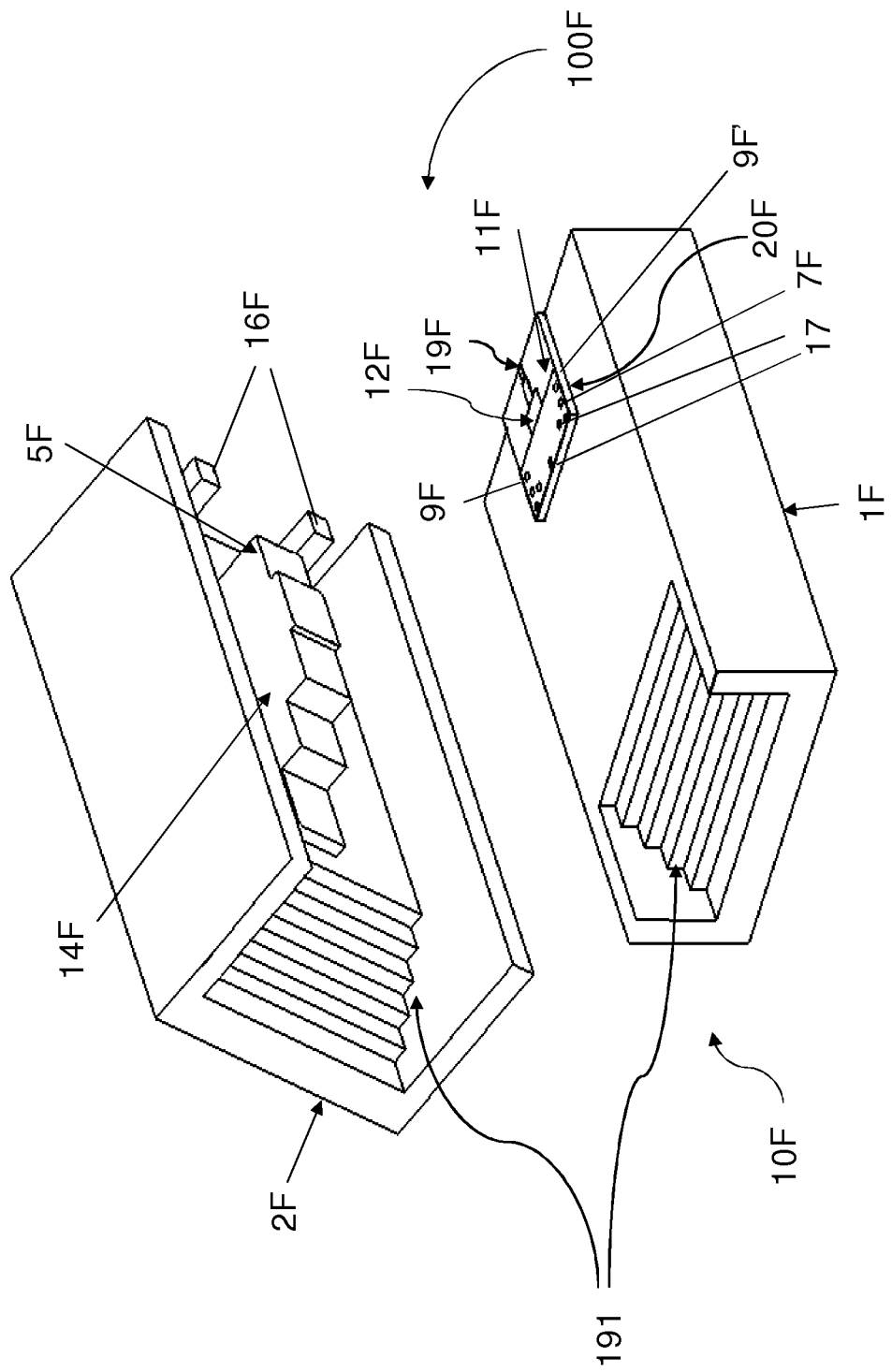
FIG. 9 is a schematic illustration of another transition arrangement between an antenna and a circuit arrangement according to the invention.

FIG. 9 shows a transition arrangement 100F according to the invention comprising a microstrip integrated circuit-to-horn antenna transition. The E-field from e.g. a microstrip line 12F of the circuit arrangement 11F, e.g. a PCB, is electromagnetically coupled to the horn antenna 10F using the intermediate transition between the SIW 20F and the antenna 10F to maximize the power transmission.

The transition 12F from the microstrip to the SIW 20F, which is directly attached to the first, here bottom, metal plate 1F of the horn antenna 10F, is straightforward and the invention is as mentioned above not limited to any particular transition between the circuit arrangement 11F and the SIW 20F, but is directed to the transition between the SIW 20F and the horn antenna 10F.

In the embodiment shown in FIG. 9, showing the transition arrangement 100F in an open, e.g. unmounted, state, the antenna 10F comprises a step tapered horn comprising two oppositely located step-tapered horn sections 191,191, the first and second metal plates 1F,2F thus comprising, in an assembled, mounted, state, one another facing stepped surfaces forming the step-tapered horn sections 191,191. The circuit arrangement 11F comprising the SIW 20F is provided on an upper surface of the first metal plate 1F, here at an end opposite to the step-tapered horn 191. On the corresponding upper surface of the second metal plate 2F, an impedance transformer, e.g. a Chebyshev transformer, 14F is provided which is extended by a $\lambda g/4$ stub 5F arranged to be located at a slight distance from the SIW 20F as discussed with reference to the preceding embodiments, such that a contactless transition is provided between the SIW 20F horn and the horn antenna 10F, i.e. achieving that the fields get off the circuit arrangement, e.g. the chip, and into the antenna 10F in a contactless manner by inverting the impedance and creating a back-short circuit.

The SIW 20F may optionally be provided with tuning means 17 comprising additional vias and a notch for the purposes of impedance tuning, which however are not necessary for the functioning of the inventive concept.

It should be clear that alternatively transitions as described with reference to FIG. 2C can be used in any of the arrangements shown in FIGS. 4-9.

It is a particular advantage that through the invention a resonance free, low-loss contactless antenna-circuit or chip transition arrangement or package can be provided.

A waveguide or a transmission line port may e.g. serve as input for an input signal, an input frequency, which hence is fed through such waveguide or transmission line.

It should be clear that the invention is not limited to the specifically illustrated embodiments, but that it can be varied in a number of ways within the scope of the appended claims.

Particularly it is applicable for in principle any circuit of an arbitrary size, active or passive, and it is not limited to any specific frequencies. Also, the invention is not limited to any specific circuit arrangements, but it is applicable to any circuit arrangement, e.g. RF circuits, MMICs, hybrid circuits, and is also intended to cover other (active or passive) circuits. It is also not limited to any particular number or type of waveguides, antennas, nor to any particular ports, or to the arrangement and locations of ports, there may be one, two, three or more ports serving as input and/or output ports. The invention also covers stubs of different shapes, rectangular, sector shaped, triangular etc. Further, the invention covers different types of planar transitions, e.g. also comprising coplanar transmission lines.

The invention claimed is:

1. A transition arrangement for providing at least one transition between a substrate integrated waveguide (SIW) and a waveguide and/or antenna structure or interface, wherein the transition arrangement comprises:
   a first conducting plate or block;
   a second conducting plate or block comprising a plate or split-block assembly comprising at least one waveguide and/or antenna port;
   wherein the SIW is arranged on the first conducting plate or block;
   wherein a number of ridges and/or impedance matching or transforming structures is/are connected to the second conducting plate or block, such that for the transition between the SIW and the waveguide and/or antenna structure or interface, at least one ridge and/or impedance matching or transforming structure is associated with, or extended with, an open circuit $\lambda g/4$ stub for inverting impedance and providing a short-circuit for electromagnetically coupling an electromagnetic field between the SIW and the ridge or impedance matching or transforming structure in an assembled state of the first and second conducting plates or blocks;
   wherein the impedance matching or transforming structure and the open circuit $\lambda g/4$ stub are configured such that, when the first and second conducting plates or blocks are assembled, a surface of the open circuit $\lambda g/4$ stub located opposite to an surface of the stub that is connected to the second plate, will be disposed spaced from a portion of a first ground plane of a the SIW, without any galvanic contact between the SIW and the ridge and/or impedance matching or transforming structure and between the SIW and the open circuit $\lambda g/4$ stub, such that a contactless, substantially planar, transition is formed between the SIW and the waveguide and/or the antenna structure.

2. The transition arrangement of claim 1, wherein the SIW is configured to be releasably connected or grounded to the first conducting plate or block.

3. The transition arrangement of claim 1:
   wherein the SIW is associated with a circuit arrangement;
   wherein the circuit arrangement comprises an RF circuit, an active circuit arrangement, or a passive circuit arrangement.

4. The transition arrangement of claim 3, wherein the SIW is disposed on a carrier substrate or a low permittivity application board connected to a chip comprising the circuit arrangement.

5. The transition arrangement of claim 3, wherein the SIW is disposed on a chip or a naked die comprising the circuit arrangement.

6. The transition arrangement of claim 1, wherein the transition arrangement is adapted for high RF-frequency signals.

7. The transition arrangement of claim 1 wherein the first and second conducting plates or blocks are configured to be mountable/demountable contactlessly.

8. The transition arrangement of claim 1, wherein the SIW comprises a dielectric substrate which on opposing sides is provided with a first ground plane and a second ground plane respectively, the first and second ground planes being electrically connected by means of vias crossing the dielectric substrate.

9. The transition arrangement of claim 8:
   wherein the second ground plane is connected to the first conducting plate such that the first SIW ground plane is arranged to serve as a common ground plane for the SIW and the $\lambda g/4$ stub; and
   wherein the second ground plane is arranged to serve as a common ground plane for the SIW and the waveguide and/or antenna structure.

10. The transition arrangement of claim 1, wherein the at least one transition comprises a transition between a SIW and a waveguide.

11. The transition arrangement of claim 10:
wherein the waveguide structure comprises at least one ridge waveguide; and
wherein the ridge or impedance matching or transforming structure comprises a ridge.

12. The transition arrangement of claim 11, wherein the transition arrangement comprises a microstrip IC to ridge waveguide back-to-back transition comprising two SIW-to-waveguide structure transitions, each comprising a ridge connected to a the open circuit λg/4 stub.

13. The transition arrangement of claim 10:
wherein the transition arrangement comprises at least one rectangular and/or groove gap waveguide; and
wherein the ridge and/or impedance matching or transforming structure comprises a ridge connected to the open circuit λg/4 stub.

14. The transition arrangement of claim 13, wherein the transition arrangement comprises a microstrip IC to waveguide back to back transition comprising two SIW-to-waveguide structure transitions, each with an impedance matching or transforming structure comprising a Chebyshev transformer connected to a respective ridge.

15. The transition arrangement of claim 1, wherein the at least one transition comprises a transition between a SIW and an antenna structure.

16. The transition arrangement of claim 15:
wherein the antenna structure comprises a slot antenna;
wherein a slot is provided in the first conducting plate or block; and
wherein the impedance matching or transforming structure provided on the second conducting plate or block comprises a ridge with a T-section for feeding the slot.

17. The transition arrangement of claim 15:
wherein the antenna structure comprises a horn antenna comprising step tapered horn sections;
wherein the electromagnetic field coupled from the circuit arrangement via the SIW is adapted to feed the horn antenna.

18. The transition arrangement of claim 1:
wherein the second conducting plate or block comprises a periodic or a quasi-periodic structure arranged such that, in an assembled state of the transition arrangement, the periodic or a quasi-periodic structure faces the SIW;
wherein the periodic or the quasi-periodic structure comprises a pin structure with a plurality of pins arranged to form a bed of pins, the pin structure being located spaced from the first conducting plate by an air gap which is smaller than λ/4.

19. The transition arrangement of claim 18, wherein the pins have dimensions adapted for a specific, selected, frequency band.

20. The transition arrangement of claim 1:
wherein the first conducting plate or block is adapted to receive the SIW; and
wherein the at least one SIW is detachably mountable onto or in the first conducting plate or block.

21. The transition arrangement of claim 1:
wherein the open circuit λg/4 stub has a smaller height than the ridge or a section of the impedance matching or transforming structure, with which it is associated such that a step is formed when the first and second conducting plates or blocks are assembled;
wherein the step is located facing an edge of the SIW;
wherein an outer edge of the ridge and/or impedance matching or transforming structure protruding beyond the open circuit λg/4 stub will is located spaced from the SIW outer edge perpendicular to the first conducting plate or block by an air gap, and spaced from the first conducting plate or block.

22. The transition arrangement of claim 1, wherein the SIW is arranged in a groove in the first conducting plate or block such that an air gap is provided between an edge of the groove in the first conducting plate or block.

23. A method for providing a transition arrangement between a circuit arrangement and a waveguide and/or antenna structure, wherein the transition arrangement comprises a first conducting plate or block and a second conducting metal plate or block comprising a split plate or block assembly comprising at least one waveguide and/or antenna port, the method comprising:
providing a substrate integrated waveguide (SIW) associated with a circuit arrangement comprising one or more circuits, and a waveguide and/or antenna structure or interface;
connecting a ridge or an impedance matching or transforming structure to the second conducting plate or block;
for each transition between the SIW and the corresponding waveguide and/or antenna structure, associating or extending the ridge or impedance matching or transforming structure with an open circuit λg/4 stub for inverting the impedance and providing a short-circuit for electromagnetically coupling the electromagnetic field between the SIW and the ridge or impedance matching or transforming structure when the first and second conducting plates or blocks are assembled;
assembling the first and second conducting metal plates or blocks by arranging them so that, with respect to one another, a surface of the open circuit λg/4 stub opposite to the side of the stub being connected to the second plate will be disposed separated from a portion of a first ground plane of the SIW by an air gap, without any galvanic contact between the SIW and the ridge and/or impedance matching or transforming structure and between the SIW and the open circuit λg/4 stub, such that a contactless, substantially planar transition is formed between the SIW and the waveguide and/or the antenna structure.

* * * * *